United States Patent
Lin et al.

(10) Patent No.: US 8,435,838 B2
(45) Date of Patent: May 7, 2013

(54) OPTIMIZATION OF DESICCANT USAGE IN A MEMS PACKAGE

(75) Inventors: Yen Hua Lin, Taiwan (CN); Rihui He, San Jose, CA (US); Lingling Wu, San Jose, CA (US); Lauren Palmateer, San Francisco, CA (US); David Heald, Solvang, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 313 days.

(21) Appl. No.: 12/680,503

(22) PCT Filed: Sep. 28, 2007

(86) PCT No.: PCT/US2007/020985
§ 371 (c)(1),
(2), (4) Date: Sep. 30, 2010

(87) PCT Pub. No.: WO2009/041951
PCT Pub. Date: Apr. 2, 2009

(65) Prior Publication Data
US 2011/0012219 A1    Jan. 20, 2011

(51) Int. Cl.
*H01L 21/00* (2006.01)
(52) U.S. Cl.
USPC ............ 438/126; 438/115; 359/245; 359/247
(58) Field of Classification Search .......... 438/106–127; 359/245, 247
See application file for complete search history.

(56) References Cited

U.S. PATENT DOCUMENTS

| | | | |
|---|---|---|---|
| 4,036,360 | A | 7/1977 | Deffeyes |
| 4,074,480 | A | 2/1978 | Burton |
| 4,531,126 | A | 7/1985 | Sadones |
| 4,844,614 | A | 7/1989 | Henderson et al. |
| 4,983,824 | A | 1/1991 | Saaski et al. |
| 5,244,707 | A | 9/1993 | Shores |
| 5,304,419 | A | 4/1994 | Shores |
| 5,591,379 | A | 1/1997 | Shores |
| 5,610,438 | A | 3/1997 | Wallace et al. |
| 5,614,785 | A | 3/1997 | Wallace et al. |
| 5,882,761 | A | 3/1999 | Kawami et al. |

(Continued)

FOREIGN PATENT DOCUMENTS

| | | |
|---|---|---|
| DE | 102 24 780 | 12/2003 |
| EP | 0 969 700 | 1/2000 |

(Continued)

OTHER PUBLICATIONS

Extended European Search Report dated Sep. 13, 2010 in App. No. 08153323.4.

(Continued)

*Primary Examiner* — Telly Green
(74) *Attorney, Agent, or Firm* — Knobbe, Martens, Olson & Bear, LLP

(57) ABSTRACT

A MEMS device may be package with a desiccant to provide a moisture-free environment. In order to avoid undesirable effects on the MEMS device, the desiccant may be selected or treated so as to be compatible with a particular MEMS device. This treatment may include baking of the desiccant to as to cause outgassing of moisture or other undesirable material. The structure of the MEMS device may also be altered to improve compatibility with particular desiccants.

16 Claims, 9 Drawing Sheets

U.S. PATENT DOCUMENTS

| | | | |
|---|---|---|---|
| 5,939,785 | A | 8/1999 | Klonis et al. |
| 6,031,657 | A | 2/2000 | Robinson et al. |
| 6,040,937 | A | 3/2000 | Miles |
| 6,261,853 | B1 | 7/2001 | Howell et al. |
| 6,445,062 | B1 | 9/2002 | Honda |
| 6,589,625 | B1 | 7/2003 | Kothari et al. |
| 6,650,455 | B2 | 11/2003 | Miles |
| 6,674,562 | B1 | 1/2004 | Miles et al. |
| 6,680,792 | B2 | 1/2004 | Miles |
| 6,791,660 | B1 | 9/2004 | Hayashi et al. |
| 7,042,643 | B2 | 5/2006 | Miles |
| 7,060,895 | B2 | 6/2006 | Kothari et al. |
| 7,123,216 | B1 | 10/2006 | Miles |
| 7,164,520 | B2 | 1/2007 | Palmateer et al. |
| 7,218,438 | B2 | 5/2007 | Przybyla et al. |
| 7,315,115 | B1 | 1/2008 | Curtin et al. |
| 7,327,510 | B2 | 2/2008 | Cummings et al. |
| 7,368,803 | B2 | 5/2008 | Gally et al. |
| 7,405,924 | B2 | 7/2008 | Gally et al. |
| 7,443,563 | B2 | 10/2008 | Palmateer et al. |
| 7,551,246 | B2 | 6/2009 | Palmateer |
| 7,573,547 | B2 | 8/2009 | Palmateer et al. |
| 7,692,839 | B2 | 4/2010 | Palmateer et al. |
| 7,701,631 | B2 | 4/2010 | Floyd |
| 7,710,629 | B2 | 5/2010 | Palmateer |
| 7,746,537 | B2 | 6/2010 | Natarajan |
| 2002/0056900 | A1 | 5/2002 | Liu et al. |
| 2002/0063322 | A1 | 5/2002 | Robbins et al. |
| 2002/0119724 | A1 | 8/2002 | Hammel |
| 2002/0149096 | A1 | 10/2002 | Liebeskind |
| 2003/0062186 | A1 | 4/2003 | Boroson et al. |
| 2003/0108306 | A1 | 6/2003 | Whitney et al. |
| 2003/0121418 | A1 | 7/2003 | Loop et al. |
| 2003/0122137 | A1 | 7/2003 | Hashimoto |
| 2003/0138656 | A1 | 7/2003 | Sparks |
| 2003/0160021 | A1 | 8/2003 | Platt et al. |
| 2003/0167798 | A1 | 9/2003 | Borrelli et al. |
| 2003/0184412 | A1 | 10/2003 | Gorrell |
| 2004/0051929 | A1 | 3/2004 | Sampsell et al. |
| 2004/0061492 | A1 | 4/2004 | Lopes et al. |
| 2004/0100677 | A1 | 5/2004 | Huibers et al. |
| 2004/0115856 | A1 | 6/2004 | Jung et al. |
| 2004/0122175 | A1 | 6/2004 | Hekal |
| 2004/0166603 | A1 | 8/2004 | Carley |
| 2004/0189195 | A1 | 9/2004 | Allemand |
| 2004/0191568 | A1 | 9/2004 | Ohshita et al. |
| 2004/0213962 | A1 | 10/2004 | Bourdelais et al. |
| 2004/0259370 | A1 | 12/2004 | Bergman |
| 2005/0074919 | A1 | 4/2005 | Patel et al. |
| 2005/0093134 | A1 | 5/2005 | Tarn |
| 2005/0253283 | A1 | 11/2005 | Dcamp et al. |
| 2006/0066600 | A1* | 3/2006 | Palmateer ............... 345/204 |
| 2006/0076632 | A1 | 4/2006 | Palmateer et al. |
| 2006/0076637 | A1 | 4/2006 | Gally |
| 2006/0077126 | A1 | 4/2006 | Kothari |
| 2006/0163711 | A1 | 7/2006 | Roels |
| 2007/0041076 | A1 | 2/2007 | Zhong et al. |
| 2007/0242341 | A1* | 10/2007 | Natarajan et al. ............. 359/290 |
| 2007/0268201 | A1 | 11/2007 | Sampsell |
| 2007/0268581 | A1 | 11/2007 | Palmateer |
| 2008/0068359 | A1* | 3/2008 | Yoshida et al. ............... 345/204 |
| 2008/0112036 | A1 | 5/2008 | Cummings |
| 2008/0130082 | A1 | 6/2008 | Kothari et al. |
| 2008/0164544 | A1 | 7/2008 | Palmateer et al. |
| 2008/0272446 | A1 | 11/2008 | Haluzak et al. |
| 2010/0172013 | A1 | 7/2010 | Palmateer |
| 2011/0053304 | A1 | 3/2011 | Palmateer et al. |

FOREIGN PATENT DOCUMENTS

| | | |
|---|---|---|
| EP | 1 220 010 | 7/2002 |
| EP | 1 251 546 | 10/2002 |
| EP | 1 418 154 | 5/2004 |
| EP | 1 640 323 | 3/2006 |
| EP | 1 640 331 | 3/2006 |
| EP | 1 640 768 | 3/2006 |
| JP | 2003-217828 | 7/2003 |
| WO | WO 02/39513 | 5/2002 |
| WO | WO 02/42716 | 5/2002 |
| WO | WO 02/093240 | 11/2002 |
| WO | WO 03/009317 | 1/2003 |

OTHER PUBLICATIONS

Official Communication dated Mar. 24, 2010 in European App. No. 07839031.7.

Keusseyan et al., A new approach for opto-electronic/MEMS packaging, Proceedings 52nd Electronic Components and Technology Conference, ECTC May 2002, pp. 259-262.

Moraja, et al., Advanced Getter Solutions at Wafer Level to Assure High Reliability to the last Generations MEMS, IEEE Reliability Physics Symposium Proceedings, 2003, pp. 458-459.

Previti et al., Getters: micromolecular scavengers for packaging, Proceedings International Symposium on Advanced Packaging Materials Processes, Properties and Interfaces, 2001, pp. 201-206.

Invitation to Pay Additional Fees for PCT/US07/020985 dated Apr. 14, 2008.

ISR and WO for PCT/US07/020985 dated Jul. 17, 2008.

IPRP for PCT/US07/020985 dated Apr. 8, 2010.

Partial European Search Report dated Mar. 25, 2010 in App. No. 08153323.4.

* cited by examiner

|  | Column Output Signals | |
|---|---|---|
|  | $+V_{bias}$ | $-V_{bias}$ |
| Row Output Signals 0 | Stable | Stable |
| $+\Delta V$ | Relax | Actuate |
| $-\Delta V$ | Actuate | Relax |

OPTIMIZATION OF DESICCANT USAGE IN A MEMS PACKAGE

BACKGROUND OF THE INVENTION

1. Field of the Invention

This invention relates to small scale electromechanical devices, such as microelectromechanical systems (MEMS) or nanoelectromechanical systems (NEMS) device.

2. Description of the Related Art

MEMS include micro mechanical elements, actuators, and electronics. Although the term MEMS is used through the specification for convenience, it will be understood that the term is intended to encompass smaller-scale devices, such as NEMS. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one aspect, a method of encapsulating a MEMS device includes providing a MEMS package, the MEMS package including a substrate supporting a MEMS device, a backplate sealed to the substrate to form the MEMS package, and a desiccant within the MEMS package, the desiccant including calcium oxide and a polymer binding, and heating the MEMS package to cause moisture within the package to be chemically absorbed by the calcium oxide.

In another aspect, a method of encapsulating a MEMS device includes providing a substrate supporting a MEMS device, providing a backplate, providing a desiccant, the desiccant including calcium oxide and polytetrafluoroethylene, baking the desiccant under conditions sufficient to cause outgassing of organics retained therein, and sealing the backplate to the substrate to form a MEMS package encapsulating the MEMS device and the desiccant.

In another aspect, a method of encapsulating a MEMS device includes providing a substrate supporting a MEMS device, providing a backplate, providing a desiccant, the desiccant including calcium oxide and a polymer binding, baking the desiccant under conditions sufficient to cause outgassing of solvents retained therein, and sealing the backplate to the substrate to form a MEMS package encapsulating the MEMS device and the desiccant.

In another aspect, a method of encapsulating a MEMS device includes providing a substrate supporting a MEMS device, the MEMS device including a movable layer, where the movable layer includes aluminum and neodymium, providing a backplate, providing a desiccant, and sealing the backplate to the substrate to form a MEMS package encapsulating the MEMS device and the desiccant.

In another aspect, A MEMS package is provided, the MEMS package including a substrate supporting a MEMS device including a movable layer, where the movable layer includes aluminum and neodymium, a backplate sealed to the substrate to form a MEMS package encapsulating the MEMS device, and a desiccant sealed within the MEMS package.

In another aspect, a MEMS device package is provided, the MEMS device package including means for absorbing moisture, first means for supporting the absorbing means, second means for supporting a MEMS structure, where the MEMS structure includes means for inhibiting the formation of protrusions on a surface of the MEMS structure, and means for sealing the second supporting means to the first supporting means.

DETAILED DESCRIPTION

Figure 1:
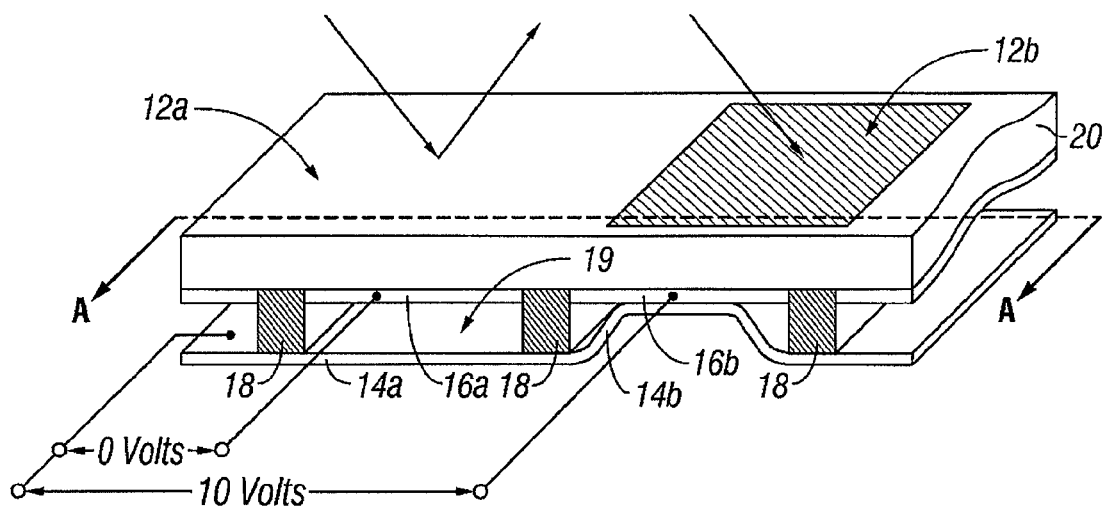
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In certain cases, it is desirable to package a MEMS device with a desiccant in order to maintain a substantially moisture-free environment within a MEMS package to extend the lifetime of the MEMS device. However, particular combinations of desiccants and MEMS devices may result in undesirable effects, including damage to the MEMS devices. In certain cases, such undesirable effects can be avoided through the selection of appropriate materials for use in the MEMS package. Certain desiccants, such as those comprising calcium oxide in a polymer matrix, have been effective at minimizing or eliminating certain undesirable effects, such as the wrinkling of a movable layer in an encapsulated MEMS device. In addition, the use of particular materials in the MEMS device has been shown to be effective in controlling other undesirable effects. The use of a movable layer which includes a mixture of aluminum and neodymium has been effective in preventing the growth of protrusions on the movable layer and on facing dielectric layers.

In other embodiments, the methods of encapsulating MEMS devices may be modified to remove moisture or other materials which may interfere with the operation of the MEMS device. In some cases, heating beyond that which is necessary to cure desiccants or adhesives may be used to induce outgassing of moisture or other undesirable material. This may be done prior to encapsulation, such that the outgassed material is removed from the desiccant before the desiccant is encapsulated. This may also be done after encapsulation, so as to drive moisture within the package into the active desiccant material. Outgassing of water can also be accomplished through storage of the desiccant in a dry environment for a period of time, but the addition of heat or vacuum can significantly reduce the necessary time.

the issues may be addressed through the use of desiccants found to be particularly suitable for certain MEMS devices, as well as the modification of MEMS devices to avoid undesirable effects. In other cases, the desiccants may be treated in some manner, such as through the application of heat, in order to reduce the presence of potentially harmful components. In other cases, the assembly process may be modified, such as by assembling the MEMS package in a moisture-free environment.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
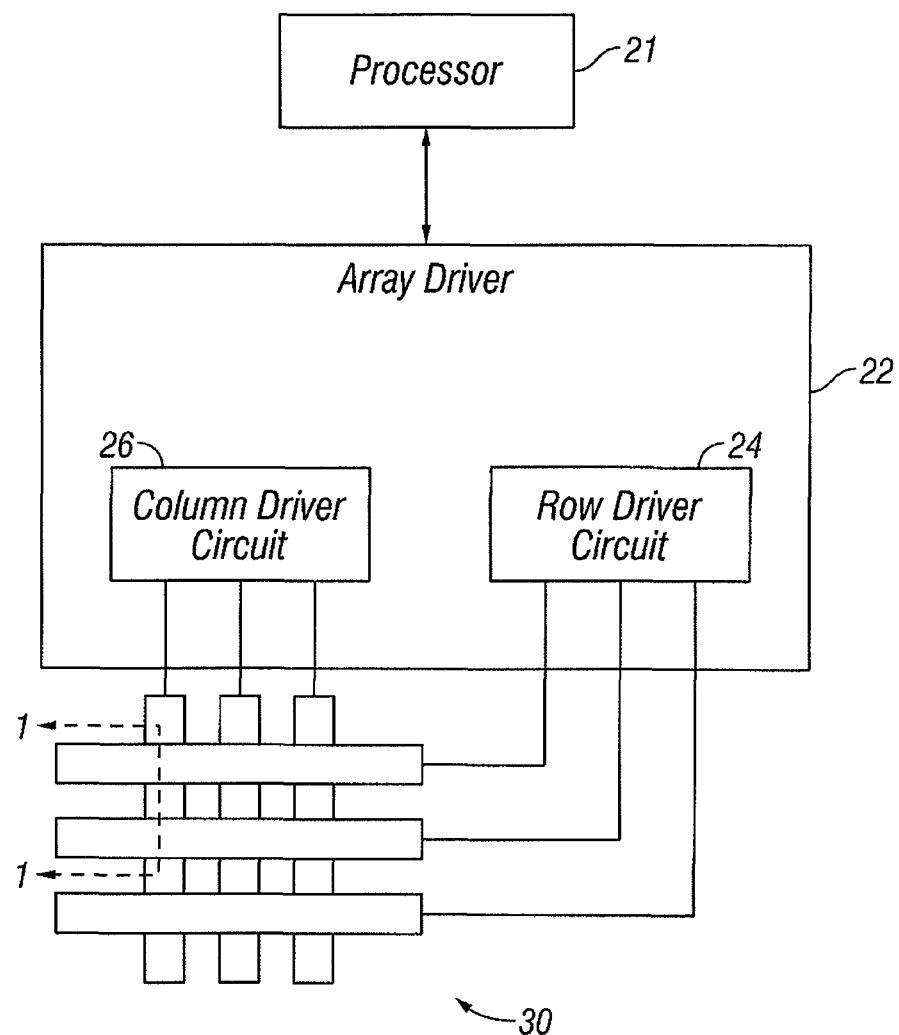
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
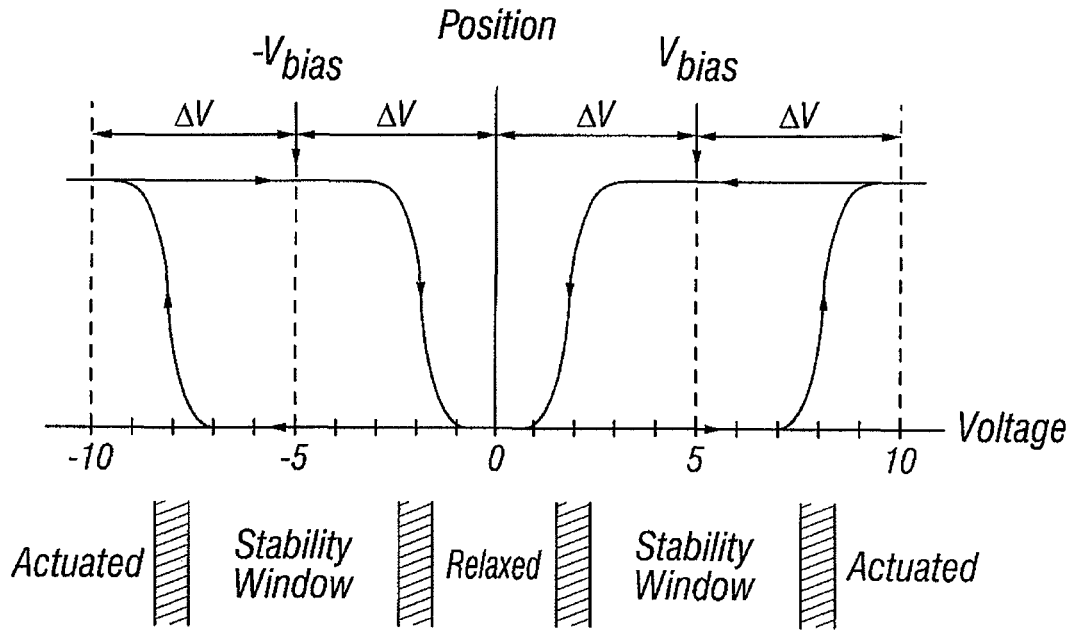
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
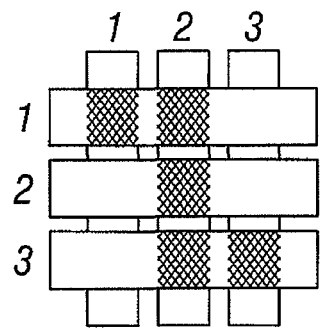
FIG. 5A illustrates one exemplary frame of display data in the 3×3 interferometric modulator display of FIG. 2.
Figure 5B:
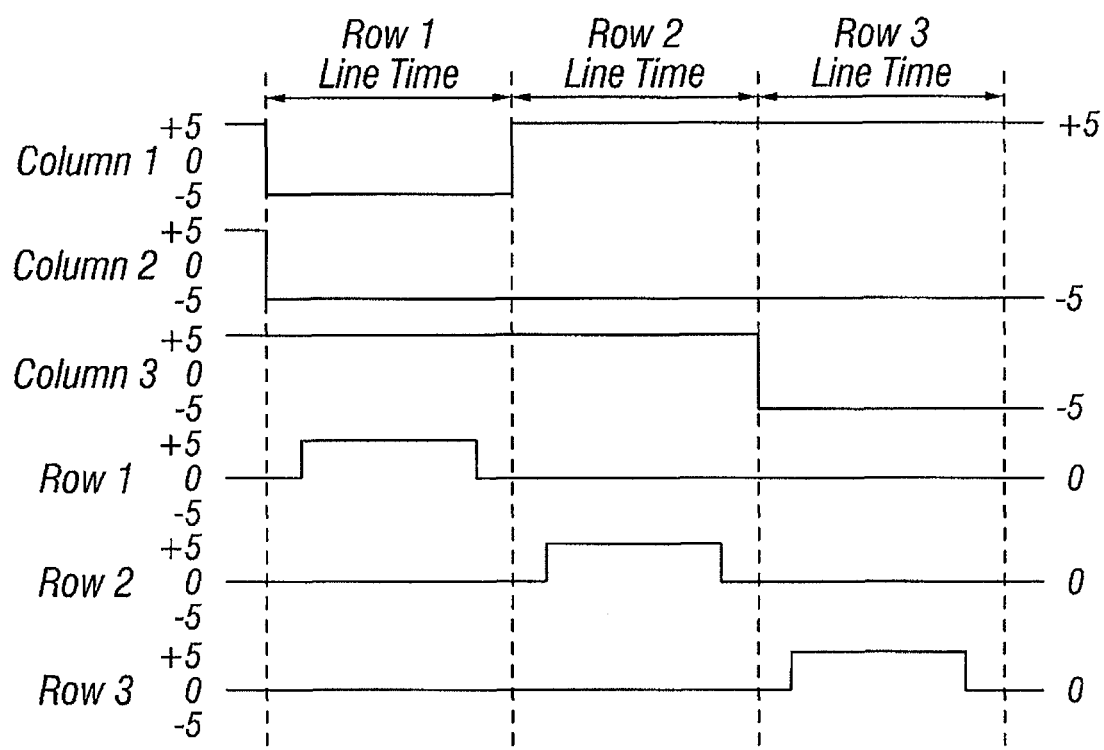
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
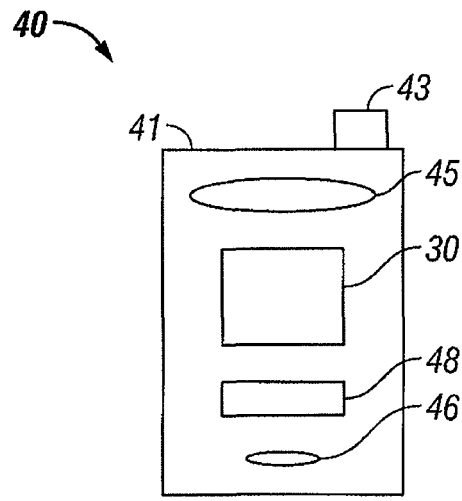
FIGS. 6A and 6B are system block diagrams illustrating an embodiment of a visual display device comprising a plurality of interferometric modulators.
Figure 6B:
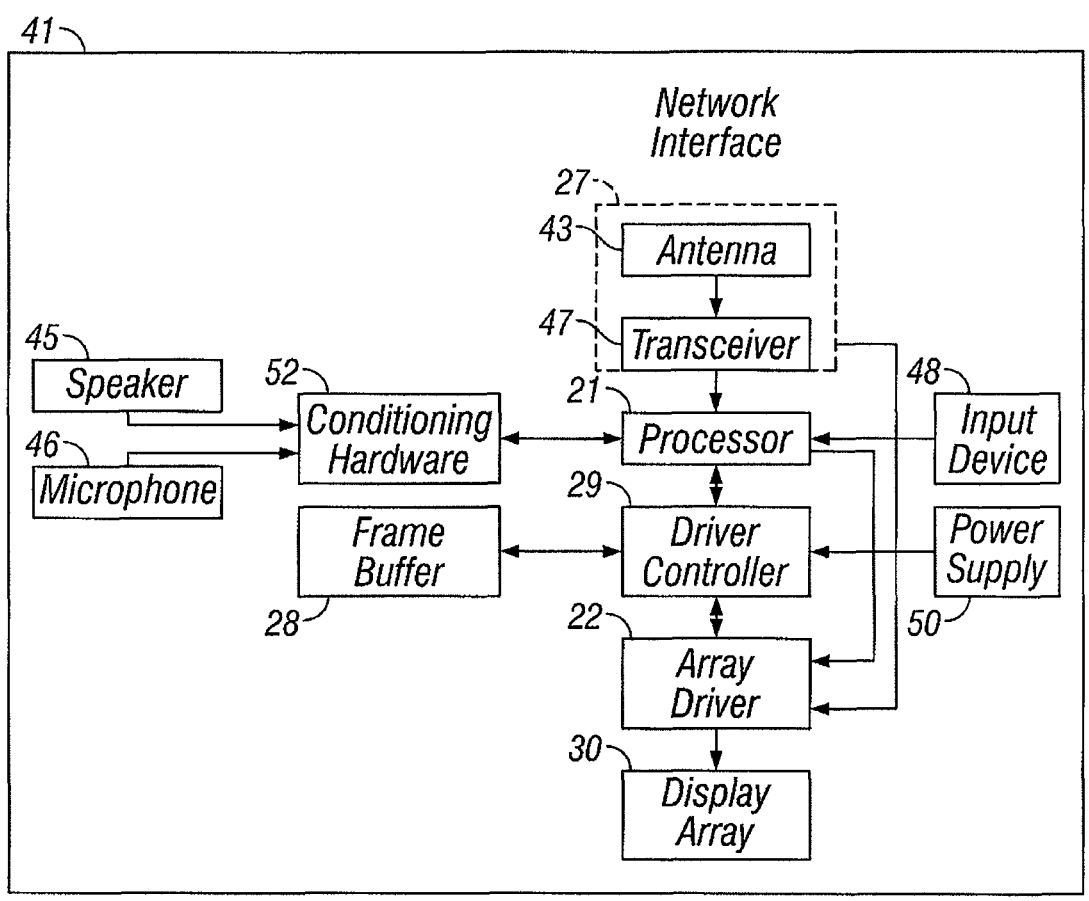

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
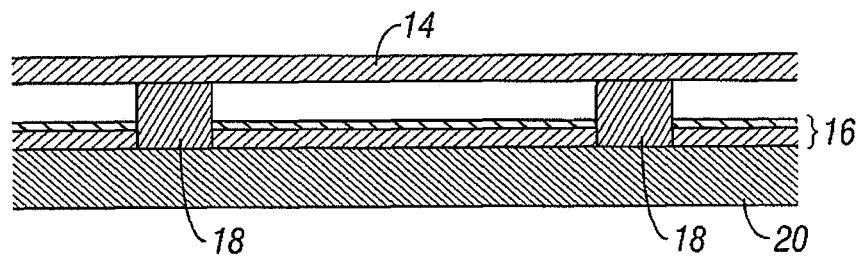
FIG. 7A is a cross section of the device of FIG. 1.
Figure 7B:
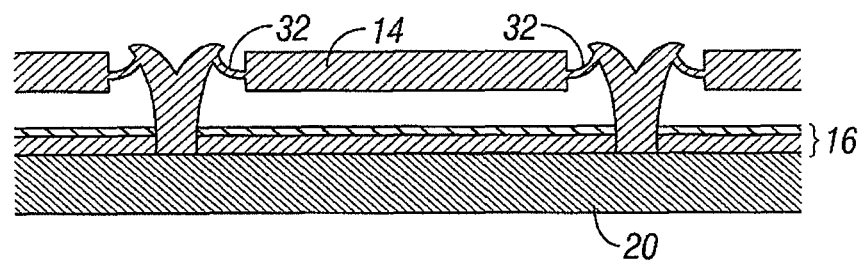
FIG. 7B is a cross section of an alternative embodiment of an interferometric modulator.
Figure 7C:
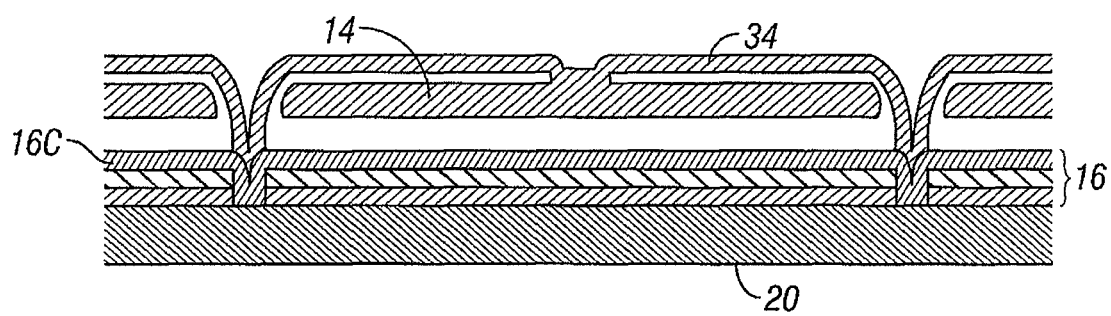
FIG. 7C is a cross section of another alternative embodiment of an interferometric modulator.
Figure 7D:
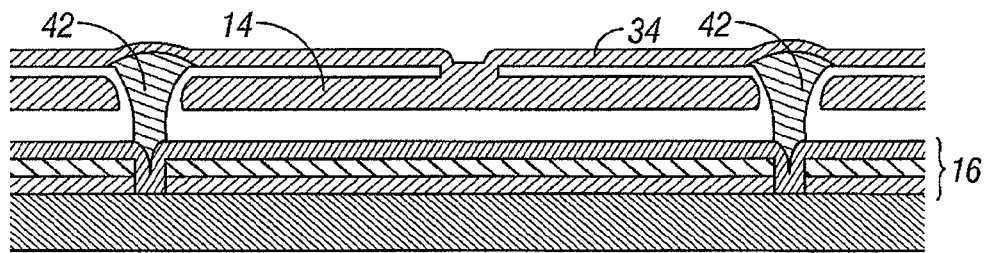
FIG. 7D is a cross section of yet another alternative embodiment of an interferometric modulator.
Figure 7E:
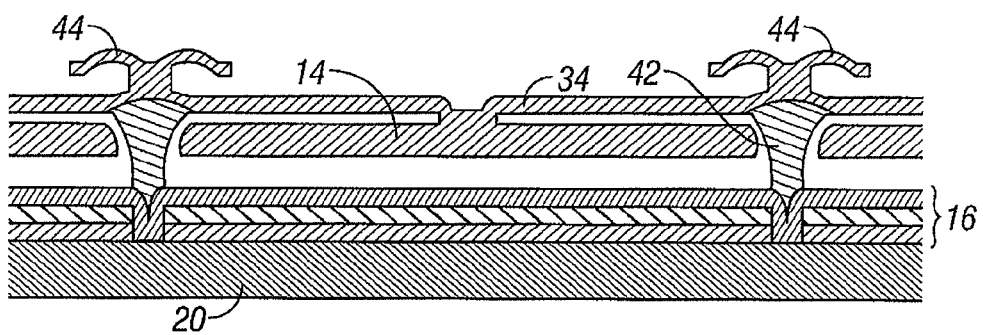
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Interferometric modulators, and other MEMS devices—particularly those having large surfaces which come into contact with one another—are particularly sensitive to failure due to humidity and moisture buildup. In order to protect such MEMS devices from humidity, and other forms of environmental or mechanical interference, such MEMS devices are often sealed within a protective package. In many embodiments, a substrate comprising an array of MEMS devices is sealed to a back plate in order to provide such a package. Although the below embodiments are primarily discussed with respect to interferometric modulators, it will be understood that a wide variety of MEMS devices may benefit from the protection afforded by such a package, and can be used in conjunction with the structures and processes described herein.

Figure 8:
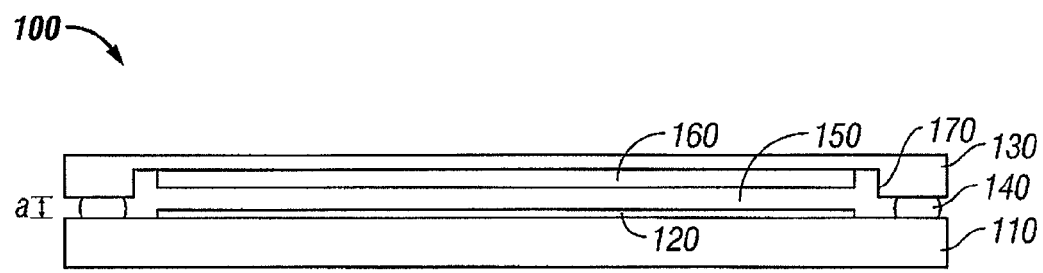
FIG. 8 is a cross-section of an embodiment of a MEMS device package comprising a desiccant supported by a shaped backplate.

FIG. 8 depicts an embodiment of a package 100, which may, for example, form a part of a display device. The package 100 comprises a light-transmissive substrate 110, which may preferably be a substantially transparent substrate, through which a viewer may view an array 120 of interferometric modulators. The substrate 100 thus provides one means for supporting the array of interferometric modulators, or other MEMS structure. The light-transmissive substrate 110 is sealed to a backplate 130 via seal 140, providing a cavity 150 in which the interferometric modulator array 120 resides. Also within the cavity 150 is a layer of desiccant 160, which in the illustrated embodiment is positioned within a recess 170 in the backplate 130. The desiccant 160 thus provides one means for absorbing moistures, the backplate 130 provides one means for supporting the desiccant, and the seal 140 provides one means for sealing the backplate 130 to the substrate 100. Because the backplate 130 is a shaped backplate comprising recess 170, the height (a) of the seal 140 can be advantageously minimized while still providing sufficient clearance for the desiccant 160 to be positioned without substantial risk of mechanical interference with the interferometric modulator array 120. It will be understood, however, that the desiccant 160 may be placed at any of a variety of locations in the package 100, and may be placed at multiple locations throughout the package 100.

A wide variety of materials can be used to form the backplate 130, including glass, metal, foil, polymer, plastic, ceramic, or semiconductor materials (e.g. silicon). The substrate 110 may comprise, for example, glass, plastic, or transparent polymer. The seal 140 may be a non-hermetic seal, and comprise a material such as a conventional epoxy-based adhesive. In other embodiments, the seal 140 may be a polyisobutylene (sometimes called butyl rubber and other times PIB), o-rings, polyurethane, thin film metal weld, liquid spin-on glass, solder, polymers, or plastics, among other types of seals that may have a range of permeability of water vapor of about 0.2-4.7 g mm/m² kPa day. In other embodiments, the seal 140 may be a hermetic seal.

MEMS devices, and in particular MEMS devices such as interferometric modulators, are sensitive to environmental conditions such as humidity. Generally, it is desirable to minimize the permeation of water vapor into the package structure and thus control the environment inside the package 100 and hermetically seal it to ensure that the environment remains constant. When the humidity within the package 100 exceeds a level beyond which surface tension from the moisture becomes higher than the restoration force of a movable element (e.g., the movable mirrors 14a, 14b described above with respect to FIG. 1) in a MEMS device such as the interferometric modulator array 120, the movable element may become stuck to an adjacent surface for a prolonged period of time, and may become permanently stuck. Because of the large contact areas and comparatively low restoration forces of the movable mirrors in an interferometric modulator, interferometric modulators are particularly susceptible to failure due to permanent adhesion. This permanent adhesion may be brought about by high humidity levels or other outgassed materials which may collect on a surface of a MEMS device and result in stiction between a movable layer and an adjacent layer. Humidity within the package 100 can contribute to other undesirable effects, such as the development of discoloration, which is particularly undesirable in an optical device such as an interferometric modulator display.

A desiccant such as desiccant 160 may be used to control moisture resident within the package 100. Desiccants may be used for packages that have either hermetic or non-hermetic seals. In packages having a hermetic seal, desiccants are typically used to control moisture resident within the interior of the package. In packages having a non-hermetic seal, a desiccant may be used to control moisture moving into the package from the environment. The skilled artisan will appreciate that a desiccant may not be necessary for a hermetically sealed package, but may be desirable to control moisture resident within the package or to capture outgases materials or materials from surfaces inside the package.

According to the embodiments described herein, the desiccant preferably is configured to absorb water molecules that permeate the display package structure once it has been manufactured as well as after sealing. As can be appreciated, the desiccant maintains a low humidity environment within the package and prevents water vapor from adversely affecting the operation of the MEMS devices and any associated display electronics.

Generally, any substance that can trap moisture while not interfering with the optical properties of the interferometric modulator array may be used as the desiccant material 160. Suitable desiccant materials include, but are not limited to, zeolites, calcium sulfate, calcium oxide, silica gel, molecular sieves, surface adsorbents, bulk adsorbents, and chemical reactants. Other desiccant materials include indicating silica gel, which is silica gel with some of its granules coated with cobalt chloride. The silica changes color as it becomes saturated with water. Calcium oxide is a material that relatively slowly absorbs water.

The desiccant may be in different forms, shapes, and sizes. In addition to being in solid or gel form, the desiccant material may alternately be in powder form. These powders may be inserted into a water vapor permeable pouch, or directly into the package without a pouch, or may be mixed with an adhesive for application. In an alternative embodiment, the desiccant may be formed into different shapes, such as cylinders or sheets, before being applied inside the package. It should be realized that the desiccant 160 may take any form, and can be of any thickness that provides the proper desiccating function for the package 100.

The desiccant 160 may be applied within the package in a variety of other ways, as well. In one embodiment, the desiccant 160 may be deposited as part of the interferometric modulator array 120. In another embodiment, the desiccant material is applied inside the package as a spray or a drip coat. The desiccant may also be printed or sprayed onto a surface of the interior of the package, or may be brushed on. The portions of the backplate which are not intended to be covered by desiccant may be protected by a mask layer. In another embodiment the desiccant may also be embedded within the seal adhesive.

Typically, in packages containing desiccants, the lifetime expectation of the device may depend on the lifetime of the desiccant. When the desiccant is fully consumed, the interferometric modulator array 120 may fail to operate as sufficient moisture enters the cavity 150 and causes damage to the array 120. The theoretical maximum lifetime of the display device is determined by the water vapor flux into the cavity 150 as well as the amount and type of desiccant material.

The theoretical lifetime of the device may be calculated with the following equations:

$$\text{lifetime} = \frac{\text{desiccant\_capacity(g)}}{\text{water\_vapor\_flux(g/area/day)} * \text{perimeter\_seal\_area}}$$

$$\text{water vapor flux} = -P\frac{dp}{dt}$$

where P is the water vapor permeation coefficient for the perimeter seal 280 and $$\frac{dp}{dt}$$

is the water vapor pressure gradient across the width of the seal 280.

In the embodiment of a display having a hermetic seal, the lifetime of the device is not as dependent on the desiccant capacity, or the geometry of the seal. In display devices wherein the seal 140 is not hermetic, the lifetime of the device is more dependent on the capacity of the desiccant to absorb and retain moisture.

In one embodiment, a method for assembling the package 100 includes fabricating the interferometric modulator array 120 on the light-transmissive substrate 110. In certain embodiments, the backplate 130 may be shaped via a sandblasting or etching process in order to form recess 170. In other embodiments, the backplate 130 may be deformed to form a recess 170, or a pre-shaped backplate provided. The desiccant 160 may then be applied in the recess 170, or elsewhere in the package. The seal 140 is then put into place, and the backplate 130 and the light transmissive substrate 110 may be brought together to form the cavity 150 which encapsulates both the desiccant 160 and the interferometric modulator array 120.

In addition to providing a controlled package environment within the package with respect to humidity, the desiccant and/or the MEMS structure may be selected to avoid or minimize the harmful effect of other material within the package environment. Such harmful material within the package environment may in certain embodiments be eliminated or minimized. In other embodiments, the MEMS structure itself may be designed so as to minimize the effects of said potentially harmful material on the MEMS structure, potentially facilitating the use of a wider range of desiccant materials.

Because of the wide range of potential interactions between the MEMS structure and other components within and comprising the encapsulating MEMS package, empirical studies of MEMS packages have provided insight regarding potential sources of damage to MEMS devices and steps which may be taken to prevent such damage.

Figure 9:
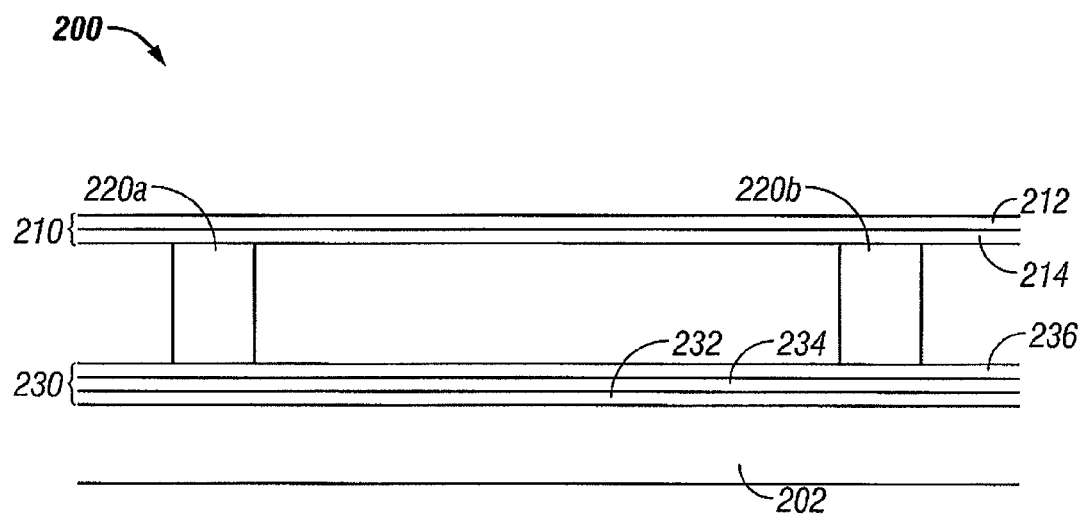
FIG. 9 is a cross-section of an embodiment of an exemplary MEMS device comprising specific layers and sublayers.

Certain MEMS devices, such as interferometric modulators discussed above, may comprise a movable mechanical layer. The mechanical layer can be actuated as discussed above, and is returned to its original position due to tensile stress within the membrane. In particular embodiments, such a mechanical layer may include a layer of aluminum, which is highly reflective, positioned adjacent an interferometric cavity, and a layer of nickel supporting the aluminum layer. FIG. 9 illustrates an embodiment of such a MEMS device 200. As can be seen, the MEMS device comprises a movable layer 210, also referred to as a mechanical layer, which includes an upper sublayer 212 and a lower sublayer 214. In certain embodiments, the upper sublayer may comprise a material having desired mechanical properties, such as nickel, and the lower sublayer 214 may comprise a highly reflective material, such as aluminum. The movable layer 210 is spaced apart from the substrate 202 and layers disposed thereon by supports 220a and 220b, which in the illustrated embodiment take the form of support posts. It will be understood that in other embodiments a wide variety of supports may be used, and that the portions movable layer may itself form a support. In an embodiment in which the MEMS device comprises an interferometric modulator, an optical stack 230 may be formed on or adjacent the substrate 202. The optical stack may comprise one or more of the following sublayers: a partially reflective layer 232, which may also be referred to as an absorber; a conductive layer 234, which may comprise a light-transmissive electrode and may be formed from ITO; and an insulator layer 236, which may comprise a light-transmissive dielectric layer.

Arrays of such MEMS devices packaged with certain desiccants, including Dynic HD-S desiccant, which is a fast acting desiccant in a polytetrafluoroethylene (Teflon) matrix, have exhibited damage to the mechanical membrane over time. This damage has taken the form of wrinkling of the mechanical membrane, along with a conversion from tensile stress to compressive stress. This change in the stress within the mechanical layer can impair the functioning of the MEMS device, and is undesirable.

In one embodiment, the invention includes a method of fabricating a MEMS device including such a desiccant by providing additional heating to the desiccant beyond what is necessary to cure the desiccant. This method is effective to inhibit such wrinkling in an encapsulated device, wherein the device is encapsulated with a fast-acting desiccant. The lifetime of the MEMS device encapsulated with the treated fast-acting desiccant may be significantly extended. The fast-acting desiccant may be maintained in a moisture-free environment, such as an $N_2$ atmosphere. In certain embodiments, the fast-acting desiccant is handled and treated in a glove box.

By exposing the desiccant to an elevated temperature for an extended period of time, outgassing of material such the potentially harmful organics is accelerated. Because this heating process may be performed prior to encapsulation of the desiccant, the outgassed material is removed and does not affect the functioning of the MEMS device to be encapsulated. The rate of outgassing is at least partially dependent on the temperature, as increased temperatures may lead to increased rates of outgassing. It will be understood that a desired duration of the heating will be dependent on the temperature at which the desiccant is baked. The desiccant alone can be baked at comparatively high temperatures. In a particular embodiment, the desiccant alone is baked at 170° C. for a period of as long as 24 hours, and in certain embodiments as long as 48 hours or longer.

Once the desiccant has been applied to a component of the MEMS package, such as the backplate, the use of high temperatures may be constrained. In particular, the adhesive securing the desiccant in place may be damaged by baking above certain temperatures, and may be the limiting factor in the maximum suitable baking temperature. The maximum temperature to which a typical pressure-sensitive adhesive (PSA) should be exposed without causing deterioration is about 120° C. In some embodiments, the baking temperature may be selected to be as high as possible without causing such damage. Thus, the bakeout temperature may be selected to be slightly below that temperature, thus, a typical baking temperature may be roughly 100° C. to 105° C., although temperatures which are higher or lower may be used. The higher the temperature, the faster the rate of outgassing may be. In further embodiments, a PSA selected to have a high temperature tolerance may be used. For example, some PSAs may be tolerant of temperatures up to or greater than 175° C.

The necessary duration for the baking process will depend on factors such as the environment and the baking temperature, but in some embodiments, a baking time of one hour may be sufficient to outgas a large amount or material. In an embodiment in which the desiccant is baked prior to placement of the desiccant on the backplate, the process is an offline process which does not slow down the assembly line. Thus, significantly larger baking durations may be used, in order to provide additional outgassing. In such an embodiment, the desiccant may be baked for as long as 24 to 48 hours, or longer.

The use of a vacuum or other dry environment can be used to accelerate outgassing, as well, in order to permit equivalent outgassing at lower temperatures or shorter durations. For example, a process which uses a 105° C. back for 48 hours may be performed instead in a vacuum for 10 hours at 90° C.

Figure 10:
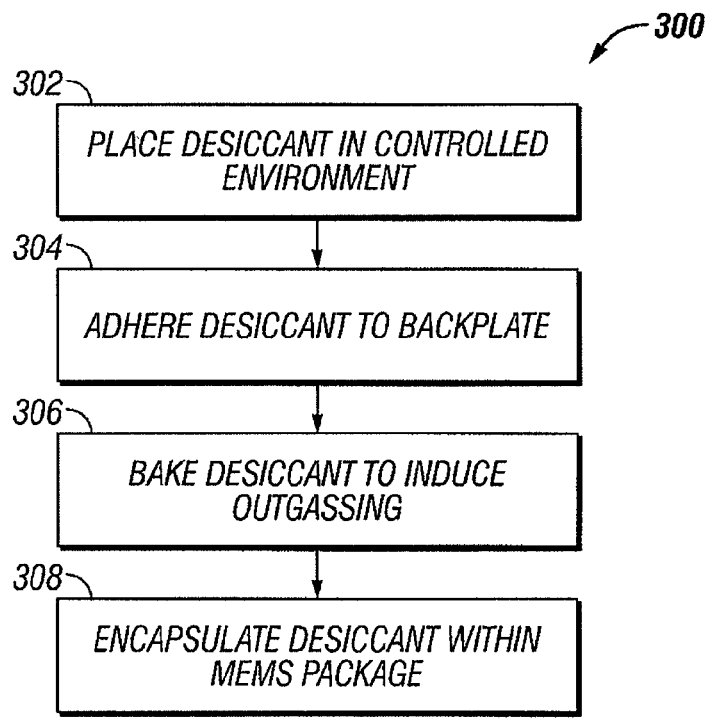
FIG. 10 is a process flow illustrating steps in the assembly of a MEMS package, wherein the desiccant is baked prior to assembly.

FIG. 10 illustrates an exemplary process flow 300 for baking a desiccant such as the calcium oxide desiccant in a polytetrafluoroethylene binding. In step 302, the desiccant is placed within a controlled environment. In step 304, the desiccant may be adhered to a backplate via an adhesive. It will be understood, however, as discussed above, that outgassing may be induced in other embodiments prior to adhering the desiccant to a backplate, and that the step of adhering a desiccant to a backplate may occur at a later stage in the manufacturing process.

In step 306, the desiccant-bearing backplate is baked. As noted above, this baking process may be done via a hot plate or other heating equipment. In embodiments in which the desiccant is adhered to a backplate, the temperature may be dependent upon the properties of the adhesive or of other components, rather than the desiccant. The duration may be dependent upon the temperature at which the desiccant is being baked. In step 308, the desiccant-bearing backplate is used to encapsulate a MEMS device within a package.

As noted above, in certain embodiments, the desiccant may be baked in an $N_2$ atmosphere or other moisture-free environment. In certain embodiments, the desiccant may be baked in a glove box. The desiccant may be baked by placing a backplate comprising the adhered desiccant on a heat plate within the controlled environment. Other method of heating the desiccant may also be used, and the desiccant need not be adhered to a backplate in order to be baked.

Another embodiment of the invention is a MEMS device having an aluminum/nickel movable layer and a calcium oxide desiccant in a polymer matrix. A suitable polymer binding is a phenol binding, such as a desiccant produced by Cookson Electronics. When a desiccant comprising calcium oxide in a polymer binding is utilized in an encapsulated MEMS package, wrinkling of the mechanical layer does not present itself, even after long periods of time at elevated temperatures. Thus, in a particular embodiment, a calcium oxide desiccant is used in a MEMS package comprising a MEMS device having an aluminum/nickel movable layer, in order to inhibit wrinkling of the movable layer and a conversion from tensile to compressive stress. In a particular embodiment, the polymer binding comprises phenol. In other embodiments, the matrix may comprise other polymers, such as epoxies.

The use of a desiccant, such as a calcium oxide desiccant in a polymer binding, can be optimized to inhibit alternate undesirable effects, as well. One such undesirable effect is the development of protrusions which may develop, for instance, on the aluminum bottom surface of an aluminum/nickel mechanical layer and on the surface of an dielectric layer, such as an $Al_2O_3$ layer, which may be the upper layer 236 in an optical stack 230 (see FIG. 9). It will be understood that in an optical device such as an interferometric modulator, the development of protrusions on one of the two surfaces facing the interferometric cavity may inhibit full actuation of the movable layer. As the movable layer is unable to contact the optical stack in the area adjacent such a protrusion, that portion of the interferometric modulator may appear as a different color. The color shift can be due, for example, to the distance between the partially reflective layer in the optical stack and the reflective lower surface of the mechanical layer, as the distance will be larger in the area surrounding the protrusion. In an embodiment in which the down state of an interferometric modulator corresponds to a dark state, the area around the protrusion may appear white.

Referring again to FIG. 9, in certain embodiments, a MEMS device may be provided in which the lower sublayer 214 of the movable layer 210 comprises a mixture of aluminum and neodymium. It has been observed that the inclusion of neodymium in the aluminum sublayer of the movable layer may serve to control migration of aluminum and prevent the formation of such protrusions on both the movable layer and the optical stack. Thus, in one embodiment, a MEMS package comprises a desiccant and a MEMS device comprising a movable layer, wherein the movable layer comprises an aluminum and neodymium mixture. In certain embodiments, the percentage of neodymium in the aluminum/neodymium layer is roughly 3%, and such an amount has been shown to be effective in controlling the growth of the protrusions, but in other embodiments, more or less neodymium may be utilized. The layer containing neodymium thus provides one means for inhibiting formations of protrusions on a surface of the MEMS structure.

As discussed above, pre-baking of the desiccant may be useful in an embodiment in which a fast acting desiccant is used. However, pre-baking of a calcium oxide and polymer desiccant is also useful. In certain embodiments, such a desiccant was provided in paste form, and was applied to a backplate and then cured to solidify the desiccant by driving off the solvents that are used as the paste carrier solution. Recommended parameters for performing this curing bake were provided by the vendor, which provide sufficient heating to solidify the paste desiccant. However, it has been discovered that baking of such desiccant at temperatures well above the temperatures required to cure the desiccant, and for periods of time longer than required to cure the desiccant, has a beneficial effect on the operation of the device.

In particular, a desiccant comprising a polymer binding, may comprise solvents which will outgas after encapsulation and interfere with the operation of the device. In particular, the solvents may cause stiction between a movable layer and a layer which the movable layer contacts, inhibiting the release of the movable layer. By providing additional baking to the desiccant, the concentrations of these solvents were drastically reduced. This was verified by Gas Chromatography Mass Spectroscopy. In certain embodiments, the desiccant may be baked at a temperature which was as high as possible without degrading the polymer binding itself. In particular embodiments, the desiccant may be baked at temperatures as high as approximately twice the recommended curing temperature, and for a duration which is as long as or longer than six times the recommended cure time. In a particular embodiment, such a desiccant was baked for three hours at a temperature of 250° C., although it will be understood that different temperatures and durations may be used. For example, in certain embodiments, temperatures higher than 220° C. may be used, and in further embodiments temperatures higher than 280° C. may be used.

In addition to the removal of solvents during the elevated temperatures of such a solvent bake, other additives included in the desiccant may also outgas, and may interfere with the operation of a MEMS device. The outgassing of other additives has been verified via Thermogravinometric Analysis. In certain embodiments, the outgassing of such additives is prevented through the use of desiccants which do not contain such additives. In a particular embodiment, a desiccant comprises only calcium oxide, a polymer, and other materials needed to provide the desired consistency (e.g., a paste).

As noted above, it may be desirable to package a fast-acting desiccant such as Dynic in a moisture-free environment. However, it may also be desirable to package a slow-acting desiccant in a moisture-free environment, as well. A slow-acting desiccant will generally not be consumed during an ambient packaging process, and such a desiccant will still have a significant useful lifetime after packaging. However, testing has shown that the polymer in a calcium oxide and polymer desiccant will quickly absorb and retain moisture from an ambient environment. In terms of moisture absorption, the polymer may reach equilibrium with the environment in roughly 15 minutes, although this time may vary based on the polymer. However, a potentially harmful amount of water may be absorbed in as little as five minutes, or sooner. The polymer can typically absorb ~1% of it dry weigh in water. This amount of water is significant when put into a small MEMS package such as a display package and may raise the level of humidity in the package to unacceptably high levels which may be as high or higher than 10,000 ppm.

Once packaged, the water retained within the polymer will either be outgassed or taken in by the calcium oxide in the desiccant. It was previously assumed that the water retained within the polymer would be absorbed by the desiccant and would not interfere with the operation of the device. Unexpectedly, however, it has been shown that in a slow-acting desiccant, the water outgassed may damage or otherwise interfere with the operation of the MEMS device before the water is ultimately absorbed by the desiccant. In particular, the water outgassed into the package environment may cause stiction in a MEMS device having a movable layer. Left alone, it may take several days for the water from the polymer to be absorbed by the desiccant.

Thus, in certain environments, a MEMS package comprising a slow-acting desiccant can be assembled in a moisture free environment, such as an $N_2$ environment. If a desiccant comprising a substantially moisture-free polymer is utilized in an assembly process in a moisture-free environment, this moisture absorption and subsequent post-encapsulation outgassing can be avoided. In certain embodiments, a substantially moisture-free desiccant may be provided by heating the polymer to drive water out of the polymer. In certain embodiments, the curing process may drive some or all of the water out of the polymer, and may be modified as discussed above to provide additional heating and drive additional water from the polymer. In other embodiments, storage at room temperature in moisture free environment may be sufficient to drive off the water. This storage may be done in the in-line system in the manufacturing process, and the increase in the assembly time may be balanced out by performing this drying process with large batches of desiccants. Because it may take more than 2 hours to evacuate the moisture from the matrix in such an environment, this time may be reduced through the application of heating or exposure to vacuum, as noted above.

In another embodiment, the package may be heated after encapsulation of the desiccant to drive retained water from the polymer within the desiccant after encapsulation of the desiccant within a MEMS package. Because of the wide variety of components comprising a MEMS package, the temperature to which the MEMS package may be heated after encapsulation may be very limited. In addition to the MEMS device itself, which may comprise heat-sensitive materials, the seal holding the MEMS package together may be damaged if the MEMS package is exposed to a temperature which is too high. Generally, a temperature of 150° C. may be suitable for certain MEMS devices. In embodiments in which a thermal epoxy is used as a seal, the MEMS package may be heated to a higher temperature. In embodiments in which a UV epoxy is used, the MEMS package may be limited to the use of a lower temperature, such as about 110° C. In certain embodiments, temperatures at or above 70° C. may be used, and in other embodiments, temperatures at or above 120° C. may be used.

By heating the MEMS package, an encapsulated desiccant which contains a moisture-containing polymer may be heated so as to drive water out of the polymer and into the calcium oxide within the desiccant. This process may accelerate the chemical absorption of the moisture by the calcium oxide, such that the water within the polymer may be fully driven into the calcium oxide prior to operation of the MEMS device. In addition, water retained within the MEMS device, the seal, the interior surfaces of the MEMS package, and the atmosphere within the package may also be driven into the calcium oxide. Furthermore, other materials, such as solids which may be outgassed by any of the package contents, may be driven into the calcium oxide to bind with the calcium oxide, and prevent possible interference of such solids on the operation of the packaged MEMS device.

Figure 11:
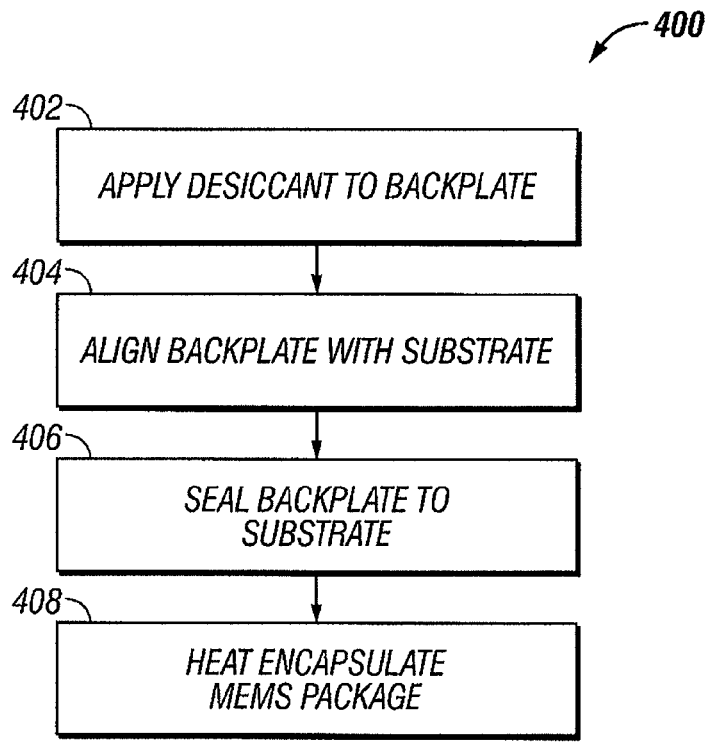
FIG. 11 is a process flow illustrating steps in the assembly of a MEMS package wherein the assembled MEMS package is baked.

FIG. 11 illustrates such an exemplary assembly process 400. In step 402, a desiccant is applied to a backplate. The process moves to a step 404 where the backplate is aligned with a substrate supporting a MEMS package. In step 406, the backplate is sealed to the MEMS substrate so as to encapsulate both the desiccant and the MEMS device. In step 408, the MEMS package is heated to a temperature which will not damage any of the components therein, for a duration sufficient to drive moisture from the polymer in the desiccant to the calcium oxide. In certain embodiments, step 408 is completed before the MEMS device encapsulated within the package is operated. In an embodiment in which the MEMS device comprises a movable layer actuatable to contact another layer, the step is preferably completed before the movable layer is actuated to contact the other layer. The possibility is thus minimized of moisture or other materials which may cause stiction being present when the movable layer contacts the other layer.

While the above detailed description has shown, described and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of encapsulating a MEMS device, the method comprising:
   providing a substrate supporting a MEMS device;
   providing a backplate;
   providing a desiccant, said desiccant comprising calcium oxide and polytetrafluoroethylene;
   baking said desiccant under conditions sufficient to cause outgassing of organics retained therein, wherein baking said desiccant under conditions sufficient to cause outgassing of organics retained therein comprises heating said desiccant beyond what is necessary to cure said desiccant; and
   sealing said backplate to said substrate to form a MEMS package encapsulating the MEMS device and the desiccant.

2. The method of claim 1, wherein baking said desiccant comprises baking said desiccant at a temperature higher than about 105° C.

3. The method of claim 2, wherein baking said desiccant comprises baking said desiccant at a temperature higher than about 120° C.

4. A method of encapsulating a MEMS device, the method comprising: providing a substrate supporting a MEMS device;
   providing a backplate;
   providing a desiccant, said desiccant comprising calcium oxide and a polymer binding;
   baking said desiccant under conditions sufficient to cause outgassing of solvents retained therein, wherein baking said desiccant under conditions sufficient to cause outgassing of solvents retained therein comprises heating said desiccant beyond what is necessary to cure said desiccant; and
   sealing said backplate to said substrate to form a MEMS package encapsulating the MEMS device and the desiccant.

5. The method of claim 4, wherein providing a desiccant comprises providing a desiccant in paste form, and wherein baking said desiccant comprising baking said desiccant at a temperature higher than that required to solidify the desiccant.

6. The method of claim 4, wherein providing a desiccant comprises providing a desiccant in paste form, and wherein baking said desiccant comprising baking said desiccant for a duration longer than that required to solidify the desiccant.

7. The method of claim 4, wherein baking said desiccant comprises baking said desiccant at a temperature higher than about 220° C.

8. The method of claim 7 wherein baking said desiccant comprises baking said desiccant at a temperature higher than about 280° C.

9. The method of claim 1, wherein heating said desiccant beyond what is necessary to cure said desiccant includes heating said desiccant at a temperature above the temperature required to cure the desiccant.

10. The method of claim 1, wherein heating said desiccant beyond what is necessary to cure said desiccant includes heating said desiccant at a temperature at least twice the temperature required to cure the desiccant.

11. The method of claim 1, wherein heating said desiccant beyond what is necessary to cure said desiccant includes heating said desiccant for a period longer than required to cure the desiccant.

12. The method of claim 1, wherein heating said desiccant beyond what is necessary to cure said desiccant includes heating said desiccant for a period at least six times longer than required to cure the desiccant.

13. The method of claim 4, wherein heating said desiccant beyond what is necessary to cure said desiccant includes heating said desiccant at a temperature above the temperature required to cure the desiccant.

14. The method of claim 4, wherein heating said desiccant beyond what is necessary to cure said desiccant includes heating said desiccant at a temperature at least twice the temperature required to cure the desiccant.

15. The method of claim 4, wherein heating said desiccant beyond what is necessary to cure said desiccant includes heating said desiccant for a period longer than required to cure the desiccant.

16. The method of claim 4, wherein heating said desiccant beyond what is necessary to cure said desiccant includes heating said desiccant for a period at least six times longer than required to cure the desiccant.

* * * * *